(12) United States Patent
Loy et al.

(10) Patent No.: US 11,349,071 B2
(45) Date of Patent: May 31, 2022

(54) MEMORY DEVICE AND A METHOD FOR FORMING THE MEMORY DEVICE

(71) Applicant: GLOBALFOUNDRIES Singapore Pte. Ltd., Singapore (SG)

(72) Inventors: Desmond Jia Jun Loy, Singapore (SG); Eng Huat Toh, Singapore (SG); Shyue Seng Tan, Singapore (SG); Steven Soss, Cornwall, NY (US)

(73) Assignee: GLOBALFOUNDRIES Singapore Pte. Ltd., Singapore (SG)

( * ) Notice: Subject to any disclaimer, the term of this patent is extended or adjusted under 35 U.S.C. 154(b) by 0 days.

(21) Appl. No.: 16/672,632

(22) Filed: Nov. 4, 2019

(65) Prior Publication Data

US 2021/0135101 A1    May 6, 2021

(51) Int. Cl.
*H01L 27/24* (2006.01)
*H01L 45/00* (2006.01)
(52) U.S. Cl.
CPC ...... *H01L 45/1253* (2013.01); *H01L 45/1608* (2013.01)
(58) Field of Classification Search
CPC combination set(s) only.
See application file for complete search history.

(56) References Cited

U.S. PATENT DOCUMENTS

| | | | |
|---|---|---|---|
| 4,420,766 A | 12/1983 | Kasten | |
| 7,629,198 B2 | 12/2009 | Kumar et al. | |
| 8,183,553 B2 | 5/2012 | Phatak et al. | |
| 9,431,604 B2 | 8/2016 | Liao et al. | |
| 2009/0168491 A1* | 7/2009 | Schricker | H01L 45/04 365/148 |
| 2009/0278109 A1 | 11/2009 | Phatak | |
| 2010/0176365 A1* | 7/2010 | Park | H01L 27/2409 257/3 |
| 2013/0214234 A1* | 8/2013 | Gopalan | H01L 45/1253 257/3 |
| 2015/0287915 A1* | 10/2015 | Chang | H01L 45/08 257/4 |

(Continued)

OTHER PUBLICATIONS

Chand et al., "Experimental and Simulation Study of Resistive Switching Properties in Novel Cu/Poly-Si/TiN CBRAM Crossbar Device", 2018 IEEE Electron Devices Technology and Manufacturing Conference Proceedings of Technical Papers, 2018, pp. 217-219, IEEE.

(Continued)

*Primary Examiner* — Moin M Rahman
(74) *Attorney, Agent, or Firm* — Viering Jentschura & Partner MBB

(57) ABSTRACT

A memory device may include at least one inert electrode, at least one active electrode, an insulating element arranged at least partially between the at least one active electrode and the at least one inert electrode, and a switching element arranged under the insulating element. The switching element may be arranged at least partially between the at least one active electrode and the at least one inert electrode. The switching element may include a first end and a second end contacting the at least one active electrode; and a middle segment between the first end and the second end, where the middle segment may at least partially contact the at least one inert electrode.

19 Claims, 9 Drawing Sheets

(56) References Cited

U.S. PATENT DOCUMENTS

2017/0229515 A1* 8/2017 Chen .................... G11C 13/004
2019/0088863 A1* 3/2019 Lu ....................... H01L 45/1233

OTHER PUBLICATIONS

Sriraman et al., "HfO2 Based Resistive Switching Non-Volatile Memory (RRAM) and Its Potential for Embedded Applications", 2012 International Conference on Solid-State and Integrated Circuit (ICSIC 2012), 2012, 5 pages, vol. 32, IACSIT Press.

* cited by examiner

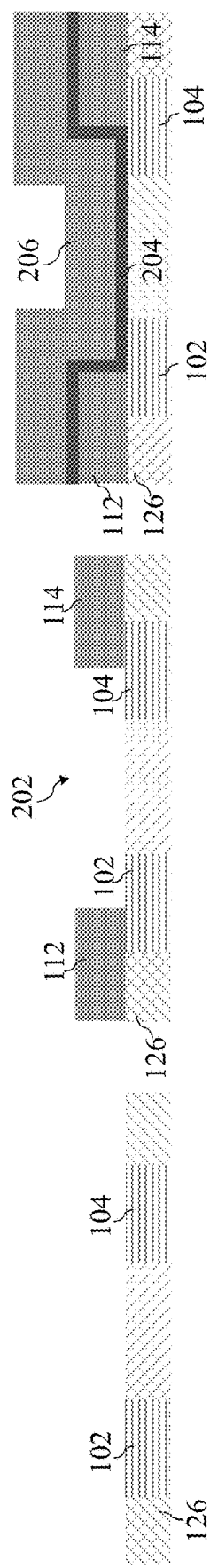
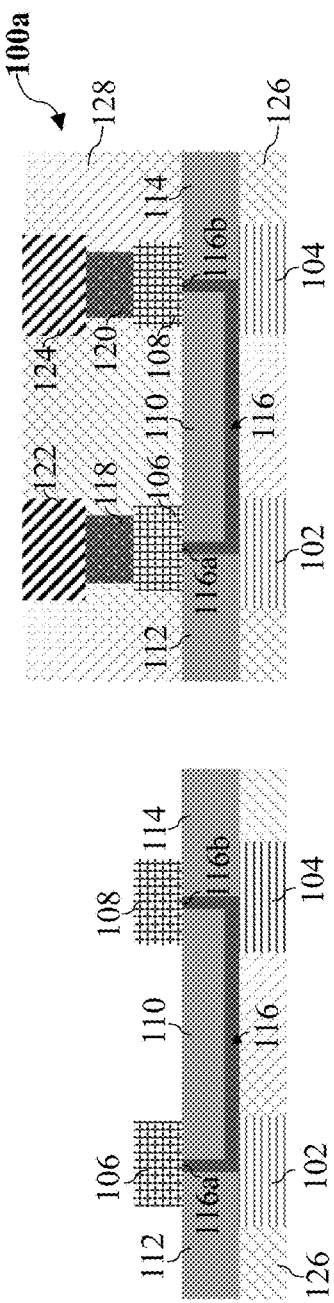

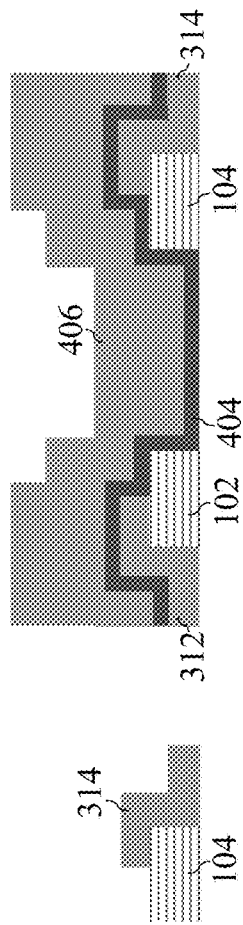
FIG. 4A
FIG. 4B
FIG. 4C
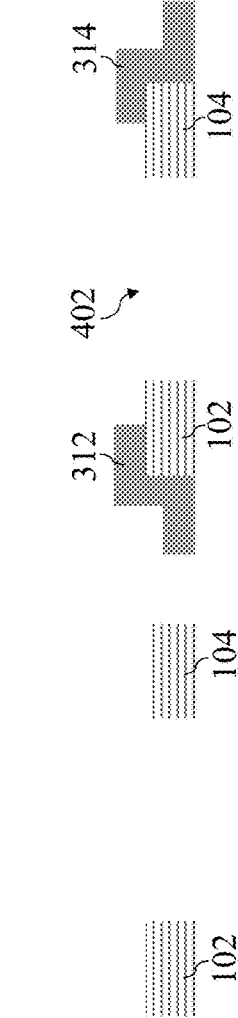
FIG. 4D
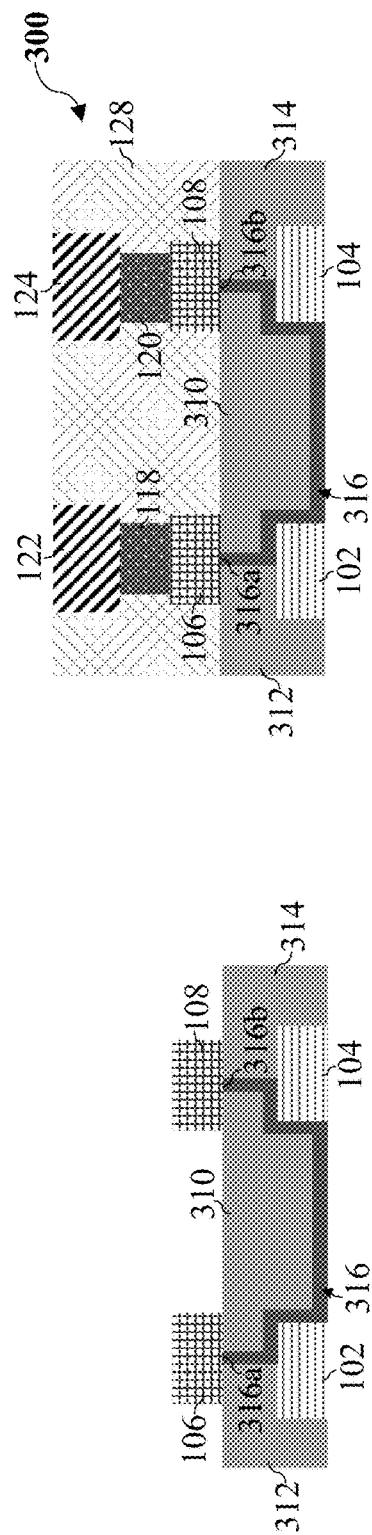
FIG. 4E

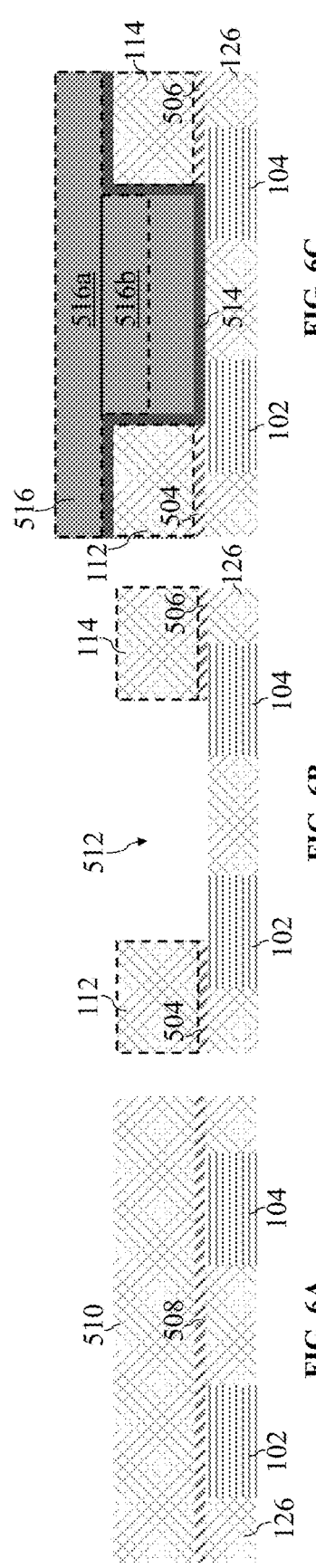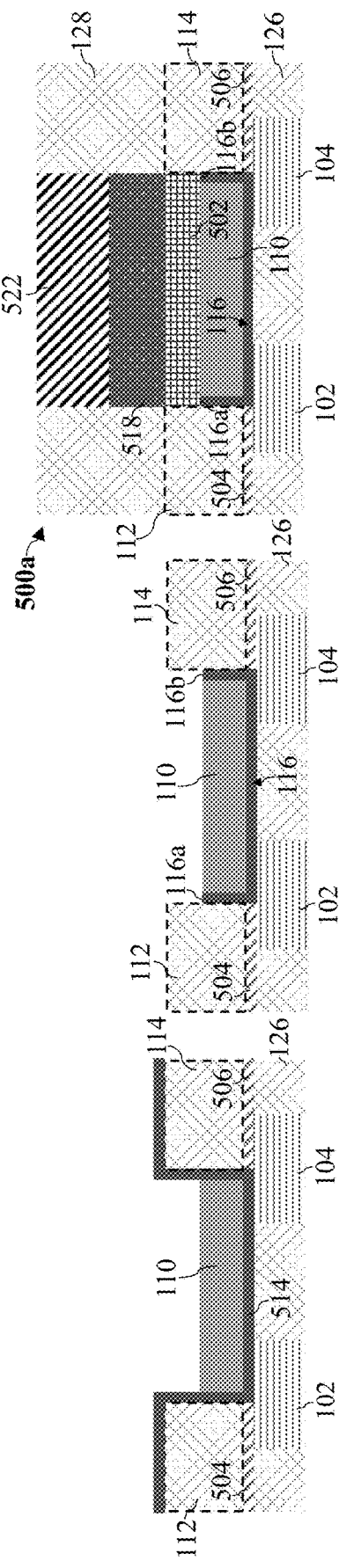
FIG. 6A  FIG. 6B  FIG. 6C
FIG. 6D  FIG. 6E  FIG. 6F

MEMORY DEVICE AND A METHOD FOR FORMING THE MEMORY DEVICE

TECHNICAL FIELD

The present disclosure relates generally to memory devices and methods for forming the memory devices.

BACKGROUND

Non-volatile memory devices are often used in consumer electronic products such as smart phones and tablets. One type of memory devices is the resistive random access memory device (RRAM) which includes a switching material (e.g. dielectric material) sandwiched between an active electrode and an inert electrode. The switching material is normally insulating. However, when a sufficiently high voltage difference (set voltage difference) is applied between the active and inert electrodes, the switching material can become conductive through the formation of conducting filaments therein. The switching material can be made insulating again by breaking the conducting filaments with a sufficiently low voltage difference (reset voltage difference) between the active and inert electrodes. When the switching material is conductive, the switching material has a low resistance and the RRAM may be referred to as being in a low resistance state (LRS). On the other hand, when the switching material is insulating, the switching material has a high resistance and the RRAM may be referred to as being in a high resistance state (HRS). The conducting filaments may be formed in the switching material by generating oxygen vacancies (when the RRAM is an oxide RRAM (OxRAM)) or by oxidizing the active electrode (when the RRAM is a conductive bridging RAM (CBRAM)). The formation of the conducting filaments is usually governed by stochastic mechanisms inherent in the switching material and is therefore, random in terms of the sizes and locations of the conducting filaments within the switching material. Accordingly, the resistance of the switching material often varies greatly over different switching cycles.

To address the above issue, some prior art methods apply higher set voltage differences to the inert and active electrodes over a longer duration. Although this may help to achieve greater consistency in the resistance of the switching material, the speed of the RRAM may be compromised. In some other prior art methods, narrower openings for the switching material may be formed so as to reduce the area available for the formation of the conducting filaments. However, this often requires etching methods that are difficult to implement. Further, there is a higher chance of shorting the active and inert electrodes when using such etching methods, and this can affect the performance of the RRAM. For example, permanent shorting of a RRAM may result in a non-workable RRAM stuck in the LRS. In addition, there is a limit to how narrow an opening can be etched in an insulating material due to design rules and lithography limitations. In some of these prior art methods, a part of the active electrode may also be formed within the opening for the switching material. In these methods, the dimensions of the active electrode may be limited by the thickness of the insulating material and by gap-fill limitations.

Accordingly, it is desirable to provide a memory device having reduced variability in its resistance and reduced chances of having shorted active and inert electrodes.

SUMMARY

According to various non-limiting embodiments, there is provided a memory device including: at least one inert electrode; at least one active electrode; an insulating element arranged at least partially between the at least one active electrode and the at least one inert electrode; and a switching element arranged under the insulating element where the switching element may be arranged at least partially between the at least one active electrode and the at least one inert electrode; wherein the switching element may include: a first end and a second end contacting the at least one active electrode; and a middle segment between the first end and the second end, wherein the middle segment may at least partially contact the at least one inert electrode.

According to various non-limiting embodiments, there is provided a method including: forming at least one inert electrode; forming an insulating element at least partially over the at least one inert electrode; forming a switching element under the insulating element; and forming at least one active electrode over the switching element and the insulating element, such that the switching element may be arranged at least partially between the at least one active electrode and the at least one inert electrode; wherein the switching element may include: a first end and a second end contacting the at least one active electrode; and a middle segment between the first end and the second end, wherein the middle segment may at least partially contact the at least one inert electrode.

According to various non-limiting embodiments, there is provided a memory structure including a plurality of memory devices, wherein each memory device may include: at least one inert electrode; at least one active electrode; an insulating element arranged at least partially between the at least one active electrode and the at least one inert electrode; a switching element arranged under the insulating element where the switching element may be arranged at least partially between the at least one active electrode and the at least one inert electrode; wherein the switching element may include: a first end and a second end contacting the at least one active electrode; and a middle segment between the first end and the second end, wherein the middle segment may at least partially contact the at least one inert electrode.

BRIEF DESCRIPTION OF THE DRAWINGS

In the drawings, like reference characters generally refer to the same parts throughout the different views. Also, the drawings are not necessarily to scale, emphasis instead generally being placed upon illustrating the principles of the invention. Embodiments of the invention will now be illustrated for the sake of example only with reference to the following drawings, in which:

FIGS. 2A to 2E show simplified cross-sectional views that illustrate a method for fabricating the memory device of FIG. 1B according to various non-limiting embodiments;

FIGS. 4A to 4E show simplified cross-sectional views that illustrate a method for fabricating the memory device of FIG. 3 according to various non-limiting embodiments;

FIGS. 6A to 6F show simplified cross-sectional views that illustrate a method for fabricating the memory device of FIG. 5B according to various non-limiting embodiments.

DETAILED DESCRIPTION

Figure 1A:
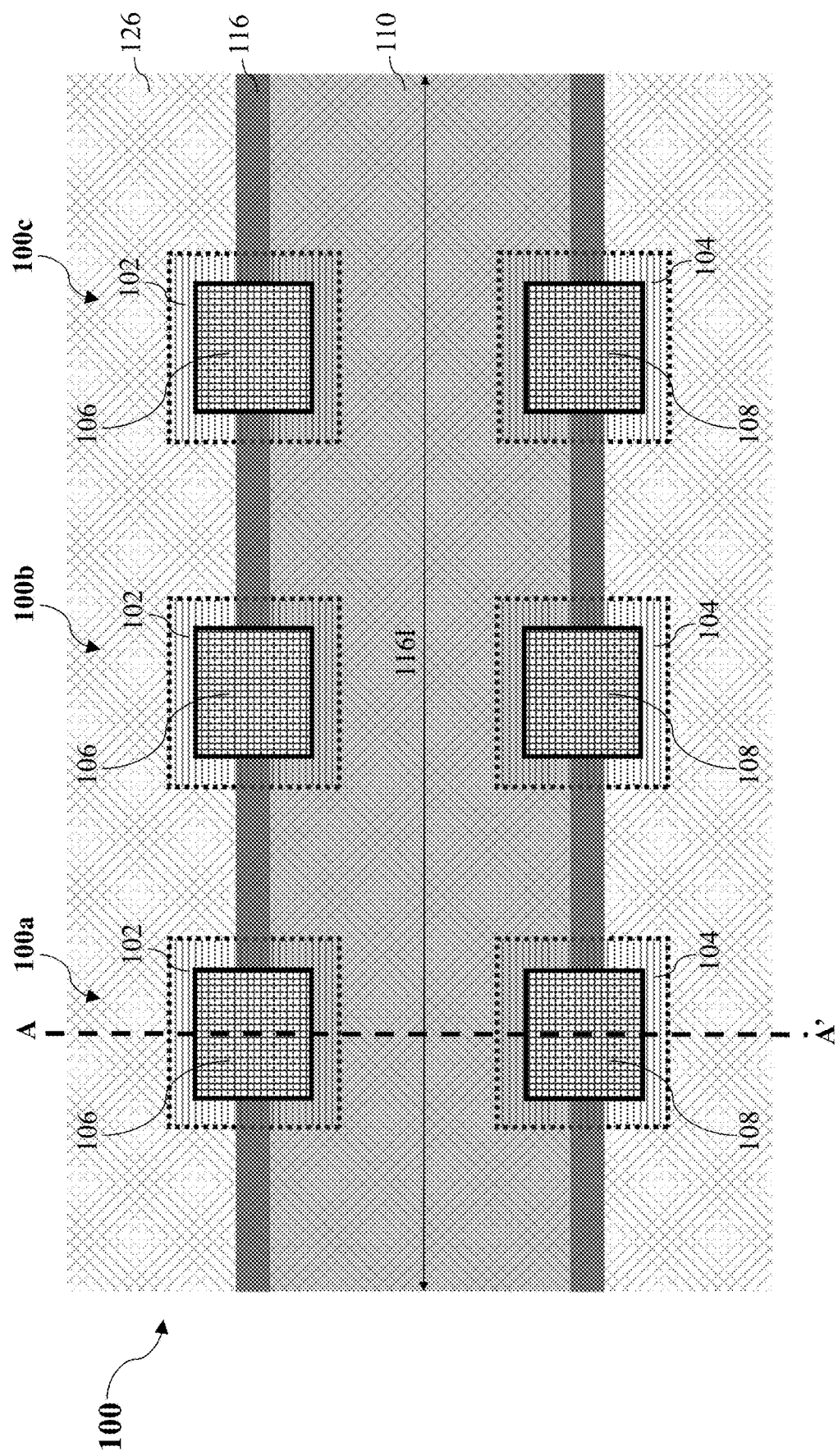
FIG. 1A shows a simplified top view of a memory structure including a plurality of memory devices according to various non-limiting embodiments.

The embodiments generally relate to devices, such as semiconductor devices. More particularly, some embodiments relate to memory devices, such as non-volatile memory devices such as RRAM devices in a non-limiting example. The memory devices may be used in several applications, for example, but not limited to, in neuromorphic computing applications and multi-bit applications.

Aspects of the present invention and certain features, advantages, and details thereof, are explained more fully below with reference to the non-limiting examples illustrated in the accompanying drawings. Descriptions of well-known materials, fabrication tools, processing techniques, etc., are omitted so as not to unnecessarily obscure the invention in detail. It should be understood, however, that the detailed description and the specific examples, while indicating aspects of the invention, are given by way of illustration only, and are not by way of limitation. Various substitutions, modifications, additions, and/or arrangements, within the spirit and/or scope of the underlying inventive concepts will be apparent to those skilled in the art from this disclosure.

Approximating language, as used herein throughout the specification and claims, may be applied to modify any quantitative representation that could permissibly vary without resulting in a change in the basic function to which it is related. Accordingly, a value modified by a term or terms, such as "about," is not limited to the precise value specified. In some instances, the approximating language may correspond to the precision of an instrument for measuring the value.

The terminology used herein is for the purpose of describing particular examples only and is not intended to be limiting of the invention. As used herein, the singular forms "a", "an" and "the" are intended to include the plural forms as well, unless the context clearly indicates otherwise. It will be further understood that the terms "comprise" (and any form of comprise, such as "comprises" and "comprising"), "have" (and any form of have, such as "has" and "having"), "include (and any form of include, such as "includes" and "including"), and "contain" (and any form of contain, such as "contains" and "containing") are open-ended linking verbs. As a result, a method or device that "comprises," "has," "includes" or "contains" one or more steps or elements possesses those one or more steps or elements, but is not limited to possessing only those one or more steps or elements. Likewise, a step of a method or an element of a device that "comprises," "has," "includes" or "contains" one or more features possesses those one or more features, but is not limited to possessing only those one or more features. Furthermore, a device or structure that is configured in a certain way is configured in at least that way, but may also be configured in ways that are not listed.

As used herein, the term "connected," when used to refer to two physical elements, means a direct connection between the two physical elements. The term "coupled," however, can mean a direct connection or a connection through one or more intermediary elements.

As used herein, the terms "may" and "may be" indicate a possibility of an occurrence within a set of circumstances; a possession of a specified property, characteristic or function; and/or qualify another verb by expressing one or more of an ability, capability, or possibility associated with the qualified verb. Accordingly, usage of "may" and "may be" indicates that a modified term is apparently appropriate, capable, or suitable for an indicated capacity, function, or usage, while taking into account that in some circumstances the modified term may sometimes not be appropriate, capable or suitable. For example, in some circumstances, an event or capacity can be expected, while in other circumstances the event or capacity cannot occur—this distinction is captured by the terms "may" and "may be."

Figure 1B:
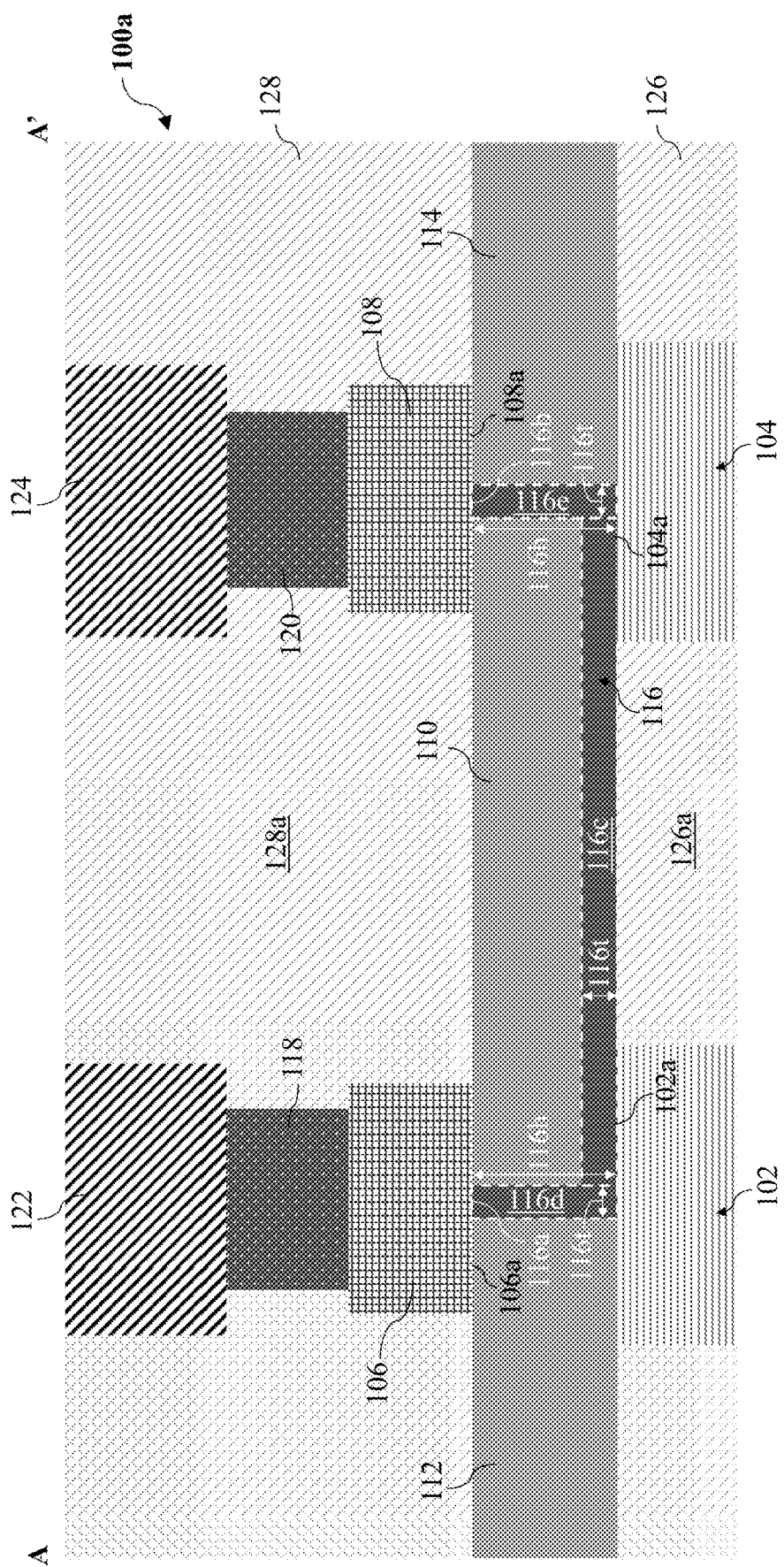
FIG. 1B shows a simplified cross-sectional view of a memory device of FIG. 1A.

FIG. 1A shows a simplified top view of a memory structure 100 according to various non-limiting embodiments. The memory structure 100 may include a plurality of memory devices 100a, 100b, 100c similar to one another. FIG. 1B shows a simplified cross-sectional view of the memory device 100a along the line A-A' of FIG. 1A. Note that although FIG. 1A shows three memory devices 100a, 100b, 100c in the memory structure 100, it is understood that the memory structure 100 may include a different number of memory devices (for example, a single memory device) similar to the memory devices 100a, 100b, 100c.

Each memory device 100a, 100b, 100c may include at least one inert electrode and at least one active electrode. For example, as shown in FIGS. 1A and 1B, the memory device 100a may include a plurality of inert electrodes including a first inert electrode 102 and a second inert electrode 104. The memory device 100a may further include a plurality of active electrodes including a first active electrode 106 and a second active electrode 108. The memory devices 100b, 100c are similar to the memory device 100a, and thus, the common features are labelled with the same reference numerals in FIG. 1A and need not be discussed.

In the exemplary non-limiting embodiment shown in FIGS. 1A and 1B, the first active electrode 106 may be arranged above the first inert electrode 102, and the second active electrode 108 may be arranged above the second inert electrode 104. The top surface of each inert electrode 102, 104 may be larger than the top surface of the respective active electrode 106, 108 above it. However, in alternative non-limiting embodiments, the inert electrodes 102, 104 and the active electrodes 106, 108 may have top surfaces of the same size, or the inert electrodes 102, 104 may have top surfaces smaller than the top surfaces of the respective active electrodes 106, 108 above them.

In various non-limiting embodiments, the inert electrodes 102, 104 may each have a thickness ranging from about 5 nm to about 10 nm, and the active electrodes 106, 108 may each have a thickness ranging from about 5 nm to about 30 nm. In various non-limiting embodiments, the inert electrodes 102, 104 may be formed of inert electrode material such as, but not limited to, ruthenium (Ru), platinum (Pt), titanium nitride (TiN), tantalum nitride (TaN), alloys thereof, or combinations thereof. In various non-limiting embodiments, the active electrodes 106, 108 may be formed of active electrode material, such as, but not limited to, tantalum (Ta), hafnium (Hf), titanium (Ti), copper (Cu), silver (Ag), cobalt (Co), tungsten (W), alloys thereof, or combinations thereof.

Each memory device 100a, 100b, 100c may further include an insulating element arranged at least partially between the active electrodes 106, 108 and the inert electrodes 102, 104. For example, as shown in FIG. 1B, the memory device 100a may include an insulating element 110 arranged partially between the active electrodes 106, 108 and the inert electrodes 102, 104. In various non-limiting embodiments, the insulating element 110 may have a thickness ranging from about 5 nm to about 10 nm. In various non-limiting embodiments, the insulating element 110 may include hard mask material, such as, but not limited to, various oxides and nitrides, for example, silicon oxide ($SiO_x$), tantalum oxide ($TaO_x$), aluminium oxide ($AlO_x$), silicon nitride ($Si_3N_4$), or combinations thereof.

Each memory device 100a, 100b, 100c may further include a switching element arranged under the insulating element 110, where the switching element may be arranged at least partially between the active electrodes 106, 108 and the inert electrodes 102, 104. For example, as shown in FIGS. 1A and 1B, the memory device 100a may include a switching element 116 arranged under the insulating element 110. The switching element 116 may be arranged partially between the inert electrodes 102, 104 and the active electrodes 106, 108.

In various non-limiting embodiments, the switching element 116 may include a first end 116a and a second end 116b contacting the active electrodes 106, 108. For example, the first end 116a may contact a bottom surface 106a of the first active electrode 106 and the second end 116b may contact a bottom surface 108a of the second active electrode 108. The switching element 116 may further include a middle segment 116c between the first end 116a and the second end 116b, where the middle segment 116c may at least partially contact the inert electrodes 102, 104. For example, as shown in FIG. 1B, the middle segment 116c may partially contact a top surface 102a of the first inert electrode 102 and a top surface 104a of the second inert electrode 104. The switching element 116 may additionally include at least one additional segment extending between the inert electrodes 102, 104 and the active electrodes 106, 108. For example, as shown in FIG. 1B, the memory device 100a may include a first additional segment 116d and a second additional segment 116e. The first additional segment 116d may extend between the first inert electrode 102 and the first active electrode 106; whereas, the second additional segment 116e may extend between the second inert electrode 104 and the second active electrode 108. Each additional segment 116d, 116e may be substantially perpendicular to the middle segment 116c in an exemplary non-limiting embodiment as shown in FIG. 1B. However, any angle between the middle segment 116c and the additional segments 116d, 116e may be possible as long as each additional segment 116d, 116e extends in a direction from the inert electrode 102, 104 towards the respective active electrode 106, 108. Further, in some non-limiting embodiments, each additional segment 116d, 116e may be substantially perpendicular to the top surface 102a, 104a of the respective inert electrode 102, 104 under it and to the bottom surface 106a, 108a of the respective active electrode 106, 108 above it. In various non-limiting embodiments, the middle segment 116c may include one or more segments between the first additional segment 116d and the second additional segment 116e, where the one or more segments may extend in a direction different from the additional segments 116d, 116e. For example, the one or more segments may be substantially horizontal. In a non-limiting embodiment, the middle segment 116c may include a single substantially horizontal segment.

In various non-limiting embodiments, the switching element 116 may be in the form of a substantially thin liner having uniform thickness 116t. In other words, the middle segment 116c, the first additional segment 116d and the second additional segment 116e may have approximately equal thicknesses 116t. A thickness 116t of the switching element 116 may range from about 1 nm to about 10 nm in various non-limiting embodiments, and may be less than 5 nm in some non-limiting embodiments. In various non-limiting embodiments, a height 116h of each additional segment 116d, 116e may be about the same, and may be substantially low. In some non-limiting embodiments, the height 116h of each additional segment 116d, 116e may be much greater than the thickness 116t. For example, the height 116h may range from about 5 nm to about 10 nm in various non-limiting embodiments. Referring to FIG. 1A, the switching elements 116 of the plurality of memory devices 100a, 100b, 100c may be formed as a single continuous switching element 116. Referring to FIG. 1A, in various non-limiting embodiments, a length 116l of the switching element 116 across the plurality of memory devices 100a, 100b, 100c may be much greater than the thickness 116t of the switching element 116. For example, the length 116l of the switching element 116 may be about 50 nm×N, where N is the number of memory devices 100a, 100b, 100c in the memory structure 100 (e.g. N=3 in the exemplary embodiment in FIG. 1A).

In various non-limiting embodiments, the switching element 116 may be formed of amorphous switching material, such as, but not limited to, magnesium oxide (MgO), tantalum oxide ($TaO_2$), hafnium oxide ($HfO_2$), titanium oxide ($TiO_2$), aluminium oxide ($AlO_2$), silicon dioxide ($SiO_2$), or combinations thereof. In various non-limiting embodiments, the switching element 116 may include polycrystalline material such as, but not limited to, poly-silicon, cadmium telluride, cadmium selenide, and gadolinium oxides. In various non-limiting embodiments, the switching element may include a mixed amorphous and crystalline material such as, but not limited to, sub-stoichiometric silicon oxide ($SiO_x$).

Each memory device 100a, 100b, 100c may also include further insulating elements arranged at least partially over the inert electrodes 102, 104 and at least partially under the active electrodes 102, 104. The switching element 116 may be at least partially arranged between the insulating element 110 and each further insulating element. For example, as shown in FIG. 1B, a first further insulating element 112 may be arranged partially over the first inert electrode 102 and partially under the first active electrode 106. A second further insulating element 114 may be arranged partially over the second inert electrode 104 and partially under the second active electrode 108. The first additional segment 116d of the switching element 116 may be arranged between the insulating element 110 and the first further insulating element 112, and the second additional segment 116e of the switching element 116 may be arranged between the insulating element 110 and the second further insulating element 114. In various non-limiting embodiments, the first and second further insulating elements 112, 114 may be thicker than the insulating element 110. In the exemplary non-limiting embodiment shown in FIG. 1B, a thickness of each further insulating element 112, 114 may be approximately equal to a sum of the thickness of the insulating element 110 and the thickness 116t of the switching element 116. In various non-limiting embodiments, each further insulating element 112, 114 may include hard mask material and may be formed of the same material as the insulating element 110.

In various non-limiting embodiments, each memory device 100a, 100b, 100c may further include one or more conductive lines. For example, as shown in FIG. 1B, the memory device 100a may further include a first conductive line 122 and a second conductive line 124. The memory device 100a may also include a first interconnect 118 to electrically couple the first active electrode 106 with the first conductive line 122, and a second interconnect 120 to electrically couple the second active electrode 108 to the second conductive line 124. In various non-limiting embodiments, the conductive lines 122, 124 and the interconnects 118, 120 may be formed of conductive material such as, but not limited to, aluminium, copper, tungsten, alloys thereof, or combinations thereof. In various non-limiting embodiments, the conductive lines 122, 124 may be used as bit lines.

In various non-limiting embodiments, each memory device 100a, 100b, 100c may further include a first dielectric layer 126. Referring to FIG. 1B, in an exemplary non-limiting embodiment, the first and second inert electrodes 102, 104 may be arranged within the first dielectric layer 126. Accordingly, the memory device 100a may include dielectric material 126a between the first and second inert electrodes 102, 104, which may help to electrically isolate these inert electrodes 102, 104. The switching element 116 may be arranged at least partially over the dielectric material 126a between the inert electrodes 102, 104. For instance, in the exemplary non-limiting embodiment as shown in FIG. 1B, the middle segment 116c of the switching element 116 may be partially arranged over the dielectric material 126a; whereas, each further insulating element 112, 114 adjacent to the switching element 116 may be arranged partially over an inert electrode 102, 104 and partially over the first dielectric layer 126.

In various non-limiting embodiments, each memory device 100a, 100b, 100c may further include a second dielectric layer 128. The insulating element 110 may be arranged over the switching element 116 and under the second dielectric layer 128. In addition, the active electrodes 106, 108, the interconnects 118, 120 and the conductive lines 122, 124 may be arranged within the second dielectric layer 128. Accordingly, the memory device 100a may also include dielectric material 128a between the first and second active electrodes 106, 108, which may help to electrically isolate these active electrodes 106, 108.

In various non-limiting embodiments, the first and second dielectric layers 126, 128 may be in the form of inter-layer dielectrics (ILD). The first and second dielectric layers 126, 128 may be formed of dielectric material such as, but not limited to, silicon dioxide ($SiO_2$), silicon nitride ($Si_3N_4$) or combinations thereof. Note that for simplicity, the conductive lines 122, 124, interconnects 118, 120 and the second dielectric layer 128 are not shown in FIG. 1A.

FIGS. 2A to 2E show simplified cross-sectional views that illustrate a method for fabricating the memory device 100a according to various non-limiting embodiments. The segments, surfaces and dimensions 116c-116e, 116t, 116h, 102a, 104a, 106a, 108a, 126a, 128a are not labelled in FIGS. 2A to 2E to avoid cluttering these figures.

Referring to FIG. 2A, the method may include forming the first dielectric layer 126 and forming the inert electrodes 102, 104. In various non-limiting embodiments, the inert electrodes 102, 104 may be patterned as conductive pads and may be positioned as low as the middle of line (MOL) contact. In various non-limiting embodiments, the method may include depositing inert electrode material over a surface on which the memory device 100a is to be formed. The inert electrode material may then be etched to form the inert electrodes 102, 104. Dielectric material may then be deposited over the surface and the inert electrodes 102, 104, and a part of the dielectric material may be removed to form the first dielectric layer 126. Removal of the dielectric material may be done using any method known to those skilled in the art, for example, a chemical mechanical polishing (CMP) process.

Referring to FIG. 2B, the method may further include forming the first further insulating element 112 partially over the first inert electrode 102 and the second further insulating element 114 partially over the second inert electrode 104. In various non-limiting embodiments, the further insulating elements 112, 114 may be formed by depositing insulating material over the first dielectric layer 126 and the inert electrodes 102, 104. The insulating material may then be etched to form a recess 202, together with the further insulating elements 112, 114.

Referring to FIGS. 2C and 2D, the method may further include forming the insulating element 110 at least partially over the inert electrodes 102, 104, and forming the switching element 116 under the insulating element 116. In various non-limiting embodiments, the method may include depositing a liner of switching material, where the deposition of the liner may be guided by the further insulating elements 112, 114 and the recess 202. In other words, the liner may be deposited at least partially along one or more surfaces of each further insulating element 112, 114. For example, referring to FIG. 2C, a liner 204 of switching material may be deposited along the top surface of each further insulating element 112, 114, and within the recess 202 (along the sides surfaces of the further insulating elements 112, 114, the top surfaces of the inert electrodes 102, 104 and the top surface of the first dielectric layer 126). In various non-limiting embodiments, the method may further include depositing insulating material 206 over the liner 204. The switching element 116 and the insulating element 110 may then be formed simultaneously by removing a part of the insulating material 206 and a part of the liner 204 (e.g. the parts above the further insulating elements 112, 114), such that a top surface of the insulating element 110, top surfaces of the further insulating elements 112, 114, and the first and second ends 116a, 116b of the switching element 116 are aligned. In various non-limiting embodiments, removing a part of the insulating material 206 and a part of the liner 204 may be done using any method as known to those skilled in the art, such as, but not limited to, a CMP process.

Referring to FIG. 2D, the method may further include forming the active electrodes 106, 108 over the switching element 116 and the insulating element 110. In various non-limiting embodiments, the first and second active electrodes 106, 108 may be formed by depositing active electrode material over the insulating elements 110, 112, 114 and the switching element 116, and etching the active electrode material. In some alternative non-limiting embodiments, the first active electrode 106 and the second active electrode 108 may be formed sequentially. For example, the first active electrode 106 may first be formed by depositing active electrode material over the first end 116a of the switching element 116 and subsequently, the second active electrode 108 may then be formed by depositing active electrode material over the second end 116b of the switching element 116. In one example, when forming each active electrode 106, 108, the parts of the insulating elements 110, 112, 114 and switching element 116 on which the active electrode 106, 108 is to be formed are exposed and the remaining parts are blocked prior to depositing the active electrode material. This may be done using for example, a mask.

Referring to FIG. 2E, the method may further include forming the second dielectric layer 128, the interconnects 118, 120 and the conductive lines 122, 124. This may be done using a typical back end of line (BEOL) process. For example, the method may include depositing dielectric material over the active electrodes 106, 108 and the insulating elements 110, 112, 114. The dielectric material may be etched to form first openings which may then be filled with conductive material to form the interconnects 118, 120. Further dielectric material may subsequently be deposited over the dielectric material and the interconnects 118, 120, and then etched to form second openings. The second openings may be filled with conductive material for the conductive lines 122, 124. Part of this conductive material may then be removed using techniques, such as, but not limited to, a CMP process, so that the top surfaces of the conductive lines 122, 124 are aligned with the top surface of the second dielectric layer 128.

The above described order for the method is only intended to be illustrative, and the method is not limited to the above specifically described order unless otherwise specifically stated.

Figure 3:
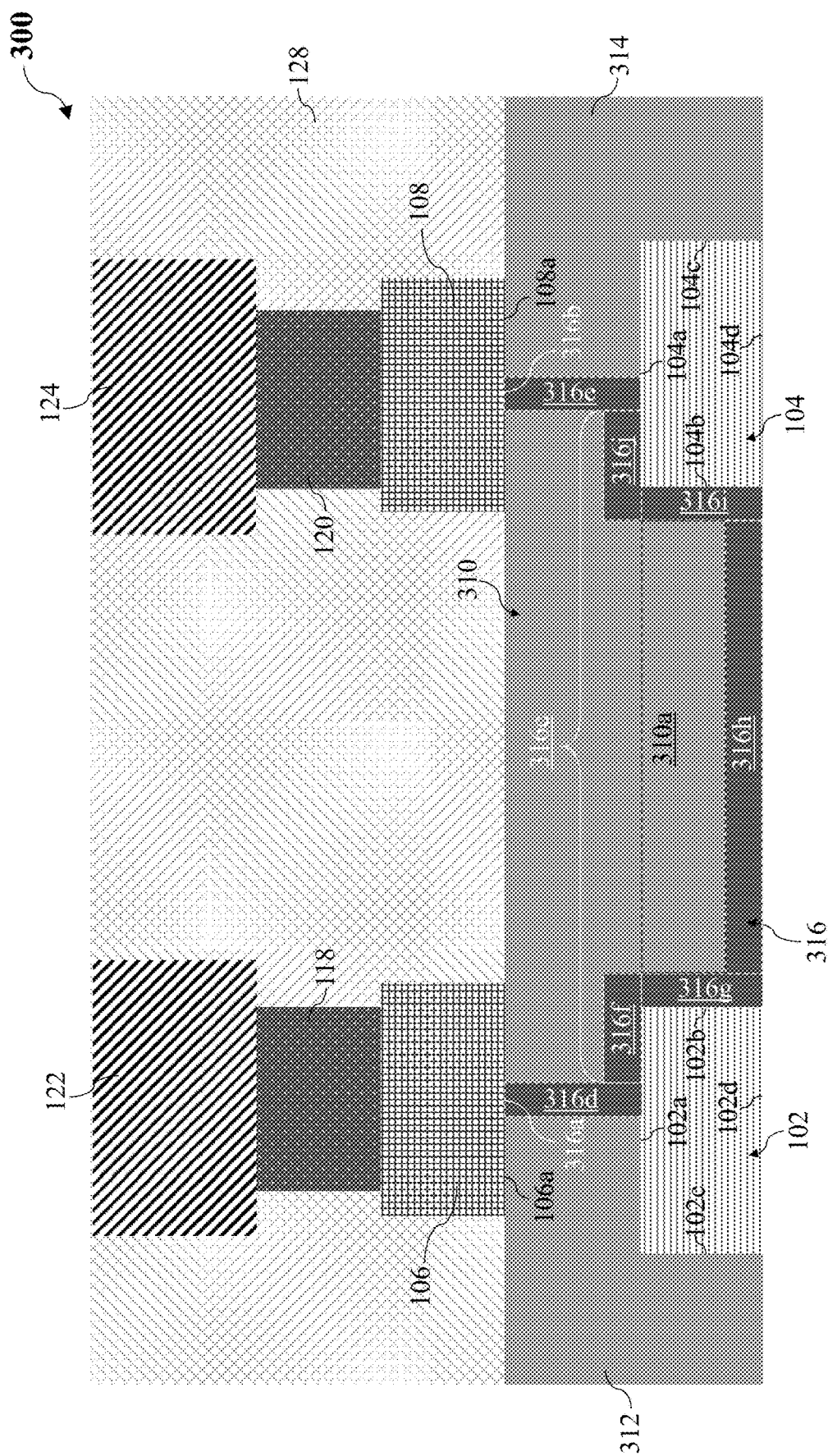
FIG. 3 shows a simplified cross-sectional view of a memory device according to alternative non-limiting embodiments.

FIG. 3 shows a simplified cross-sectional view of a memory device 300 according to various non-limiting embodiments. The memory device 300 is similar to memory device 100*a*, and thus the common features are labelled with the same reference numerals and need not be discussed.

The memory device 300 may also include insulating elements 310, 312, 314 and a switching element 316. Similar to the switching element 116 of the memory device 100, the switching element 316 of the memory device 300 may have a uniform thickness ranging from about 1 nm to about 10 nm. The switching element 316 may also have first and second ends 316*a*, 316*b* contacting the bottom surfaces 106*a*, 108*a* of the first and second active electrodes 106, 108 respectively. However, the first dielectric layer 126 may be absent in the memory device 300. Further, the shapes of the switching element 316 and the insulating elements 310, 312, 314 in the memory device 300 may differ from those in the memory device 100*a*.

For example, as shown in FIG. 3, while the first and second additional segments 316*d*, 316*e* of the memory device 300 may also extend between the active electrodes 106, 108 and the inert electrodes 102, 104 in a manner similar to that in the memory device 100, the middle segment 316*c* (between the first and second additional segments 316*d*, 316*e*) may include alternating first segments 316*f*, 316*h*, 316*j* and second segments 316*g*, 316*i*, where the first segments 316*f*, 316*h*, 316*j* and the second segments 316*g*, 316*i* may extend in different directions. In an exemplary non-limiting embodiment as shown in FIG. 3, the first segments 316*f*, 316*h*, 316*j* may extend in a different direction from the additional segments 316*d*, 316*e*; whereas, the second segments 316*g*, 316*i* may extend in a same direction as the additional segments 316*d*, 316*e*. In a non-limiting example, the first segments 316*f*, 316*h*, 316*j* may be substantially horizontal, and the second segments 316*g*, 316*i* may extend substantially perpendicular to the substantially horizontal segments 316*f*, 316*h*, 316*j*. The middle segment 316*c* may contact a top surface 102*a*, 104*a* and a side surface 102*b*, 104*b* of each of the first and second inert electrodes 102, 104. For instance, the segment 316*f* may be arranged over and may contact the top surface 102*a* of the first inert electrode 102; the segment 316*g* (under the segment 316*f*) may be arranged alongside and may contact the side surface 102*b* of the first inert electrode 102; the segment 316*j* may be arranged over and may contact the top surface 104*a* of the second inert electrode 104; and the segment 316*i* (under the segment 316*j*) may be arranged alongside and may contact the side surface 104*b* of the second inert electrode 104. The segment 316*h* may be arranged between the segments 316*g*, 316*i*, and a bottom surface of the segment 316*h* may be aligned with bottom surfaces 102*d*, 104*d* of the inert electrodes 102, 104.

Similar to the insulating element 110 of the memory device 100*a*, the insulating element 310 may also be arranged partially between the active electrodes 106, 108 and the inert electrodes 102, 104. However, unlike the insulating element 110 of the memory device 100*a*, the insulating element 310 of the memory device 300 may extend between the first and second inert electrodes 102, 104. For example, as shown in FIG. 3, the insulating element 310 may include a part 310*a* extending between the first and second inert electrodes 102, 104.

In the exemplary non-limiting embodiment shown in FIG. 3, the first and second further insulating elements 312, 314 may each have an L shape. The first further insulating element 312 may be arranged over the top surface 102*a* of the first inert electrode 102 and may extend alongside a side surface 102*c* of the first inert electrode 102. The second further insulating element 314 may be arranged over the top surface 104*a* of the second inert electrode 104 and may extend alongside a side surface 104*c* of the second inert electrode 104.

FIGS. 4A to 4E show simplified cross-sectional views that illustrate a method for fabricating the memory device 300 according to various non-limiting embodiments. In FIGS. 4A to 4E, the segments and surfaces 102*a*-102*d*, 104*a*-104*d*, 106*a*, 108*a*, 310*a*, 316*c*-316*j*, are not labelled to avoid cluttering these figures.

Referring to FIG. 4A, the method may include forming the inert electrodes 102, 104 over a surface on which the memory device 300 is to be formed. In various non-limiting embodiments, the inert electrodes 102, 104 may be formed by depositing inert electrode material over the surface and etching the inert electrode material.

Referring to FIG. 4B, the method may further include forming the first further insulating element 312 partially over the first inert electrode 102 and the second further insulating element 314 partially over the second inert electrode 104. In various non-limiting embodiments, the further insulating elements 312, 314 may be formed by depositing insulating material over the inert electrodes 102, 104 and over the surface on which the memory device 300 is to be formed. The insulating material may then be etched to form a recess 402, together with the further insulating elements 312, 314.

Referring to FIGS. 4C and 4D, the method may further include forming the insulating element 310 partially over the inert electrodes 102, 104, and forming the switching element 316 under the insulating element 310. In various non-limiting embodiments, the method may include depositing a liner of switching material, where the deposition may be guided by the further insulating elements 312, 314 and the recess 402. For example, as shown in FIG. 4C, a liner 404 of switching material may be deposited along the top and side surfaces of the further insulating elements 312, 314, and within the recess 402 (along side surfaces of the further insulating elements 312, 314, along top and side surfaces of the inert electrodes 102, 104 and along the surface on which the memory device 300 is to be formed). The method may further include depositing insulating material 406 over the liner 404. The switching element 316 and the insulating element 310 may then be formed simultaneously by removing a part of the insulating material 406 and a part of the liner 404 (e.g. the parts above the further insulating elements 312, 314), such that a top surface of the insulating element 310, top surfaces of the further insulating elements 312, 314, and the ends 316a, 316b of the switching element 316 are aligned. In various non-limiting embodiments, removing a part of the insulating material 406 and the liner 404 may be done using any method as known to those skilled in the art, such as, but not limited to, a CMP process. As shown in FIGS. 4C and 4D, an end of each further insulating element 312, 314 may also be removed such that the remaining further insulating element 312, 314 forms an L-shaped element. In various non-limiting embodiments, this may be done by etching the further insulating elements 312, 314.

Referring to FIGS. 4D and 4E, the method may further include forming the active electrodes 106, 108, the second dielectric layer 128, the interconnects 118, 120 and the conductive lines 122, 124 in a similar manner as that described with reference to FIGS. 2D and 2E.

The above described order for the method is only intended to be illustrative, and the method is not limited to the above specifically described order unless otherwise specifically stated. As compared to the fabrication process of the memory device 100a, the step of removing the dielectric material to form the first dielectric layer 126 may be omitted when fabricating the memory device 300. This helps to simplify the fabrication process of the memory device 300.

Figure 5A:
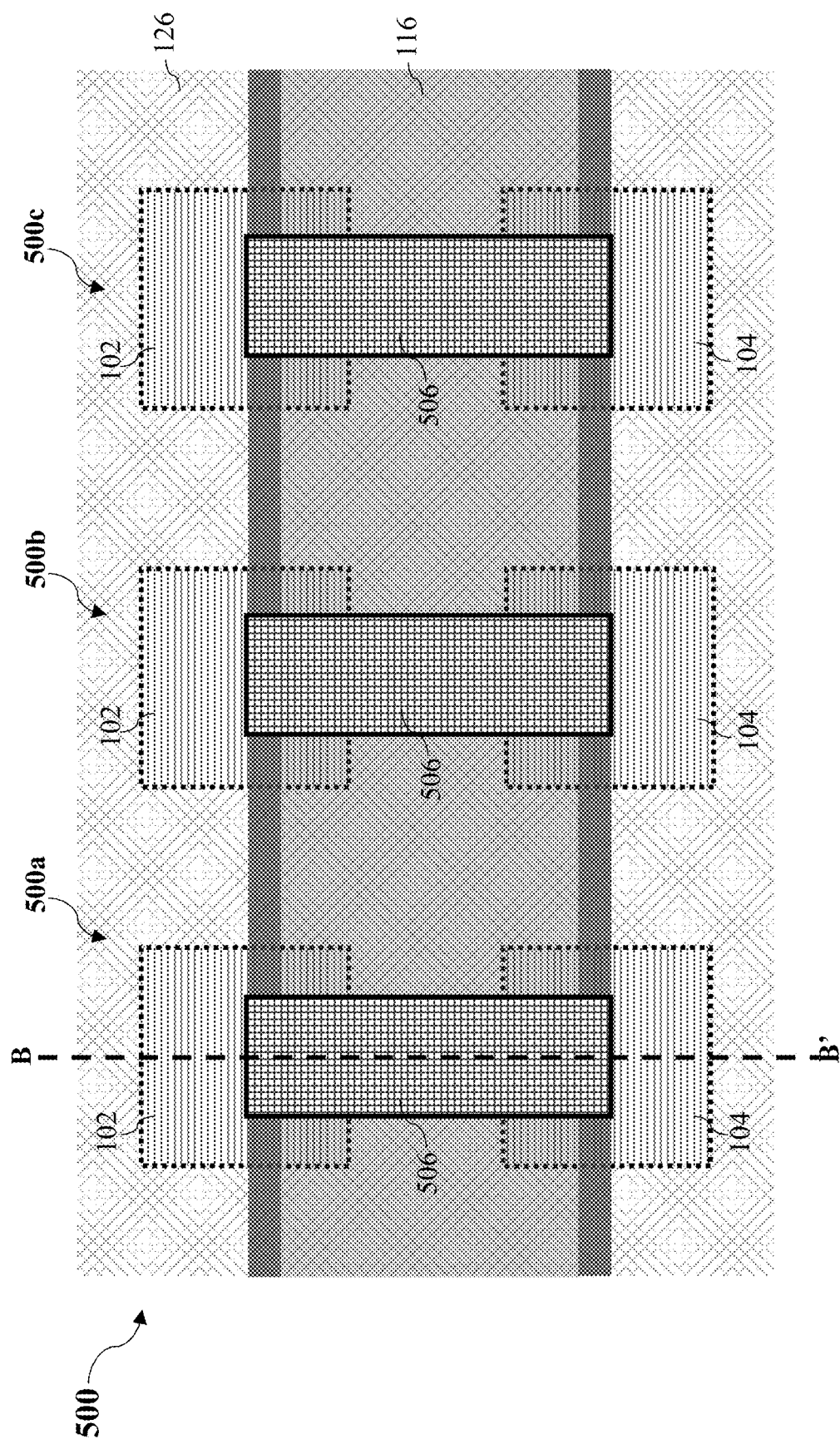
FIG. 5A shows a simplified top view of a memory structure including a plurality of memory devices according to alternative non-limiting embodiments.
Figure 5B:
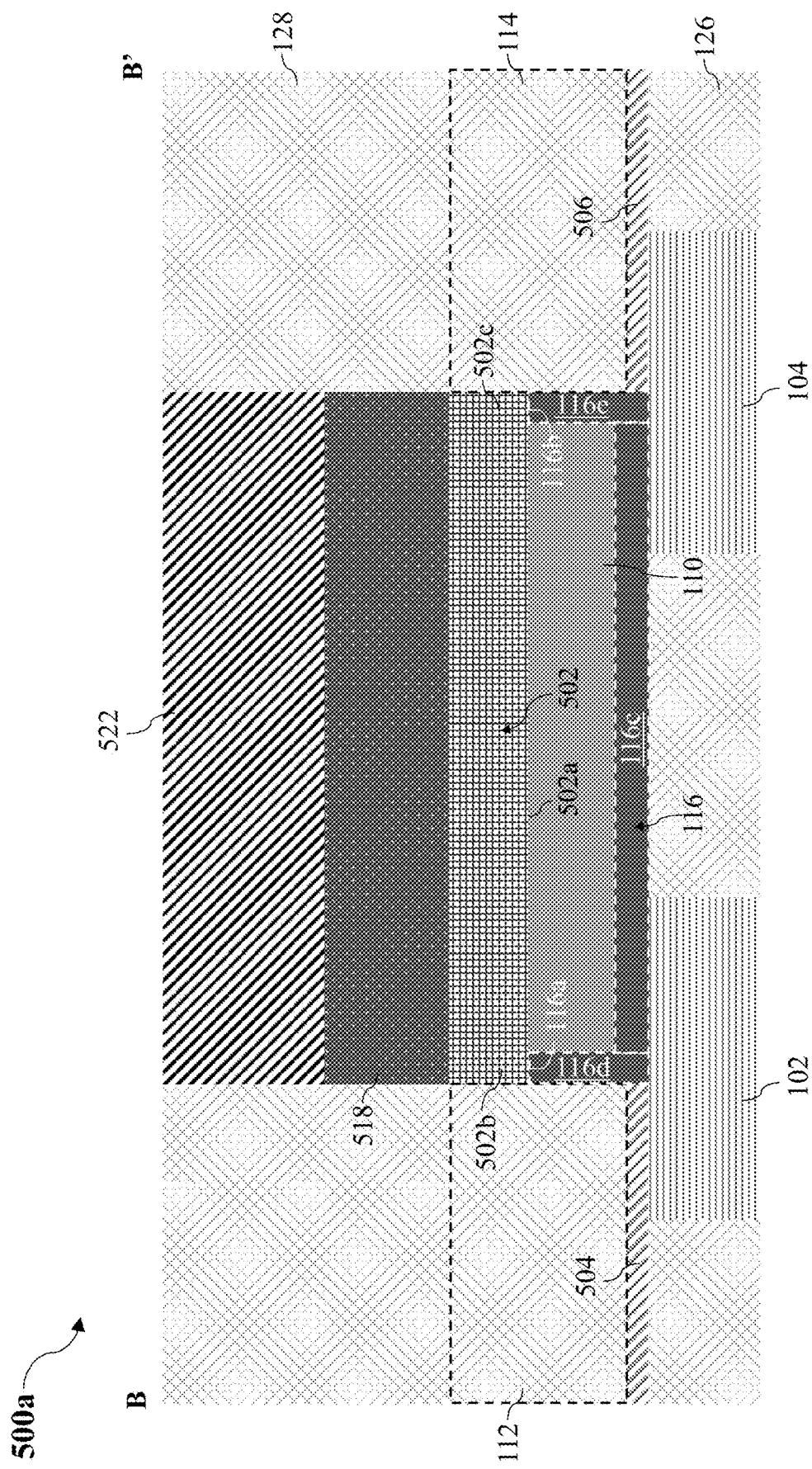
FIG. 5B shows a simplified cross-sectional view of a memory device of FIG. 5A.

FIG. 5A shows a simplified top view of a memory structure 500 according to various non-limiting embodiments. The memory structure 500 may include a plurality of memory devices 500a, 500b, 500c similar to one another. FIG. 5B shows a simplified cross-sectional view of the memory device 500a along the line B-B'. The memory structure 500 is similar to the memory structure 100, and thus the common features are labelled with the same reference numerals and need not be discussed. Similarly, although FIG. 5A shows three memory devices 500a, 500b, 500c in the memory structure 500, it is understood that the memory structure 500 may include a different number of memory devices similar to the memory devices 500a, 500b, 500c.

As shown in FIGS. 5A and 5B, similar to the memory device 100a, each memory device 500a, 500b, 500c may also include first and second inert electrodes 102, 104, a switching element 116 and an insulating element 110. The switching element 116 and the insulating element 110 in each memory device 500a, 500b, 500c may be arranged relative to each other and to the inert electrodes 102, 104 in a similar manner as those in the memory device 100a.

However, unlike the memory devices 100a, 100b, 100c, each memory device 500a, 500b, 500c may include only a single active electrode 502. In the exemplary non-limiting embodiment shown in FIG. 5B, the active electrode 502 may be arranged to extend over the insulating element 110 and the switching element 116. The first and second ends 116a, 116b of the switching element 116 may contact a bottom surface 502a of the active electrode 502. For example, the first end 116a of the switching element 116 may contact the bottom surface 502a at a first end region 502b; whereas, the second end 116b of the switching element 116 may contact the bottom surface 502a at a second end region 502c (opposite the first end region 502b).

Further, in each memory device 500a, 500b, 500c, the further insulating elements 112, 114 may be arranged adjacent to the active electrode 502. In other words, the active electrode 502 may be arranged between the further insulating elements 112, 114. As shown in FIG. 5B, the first further insulating element 112 may be arranged over a first neutral layer 504 and the second further insulating element 114 may be arranged over a second neutral layer 506 in an exemplary non-limiting embodiment. A part of the switching element 116 and the insulating element 110 may be arranged between the further insulating elements 112, 114; whereas, another part of the switching element 116 and the insulating element 110 may be arranged between the neutral layers 504, 506.

In the exemplary non-limiting embodiment shown in FIG. 5B, the further insulating elements 112, 114 may be formed of a same material as the dielectric layers 126, 128. Although, in alternative non-limiting embodiments, the further insulating elements 112, 114 may be formed of a different material from the dielectric layers 126, 128. For example, the further insulating elements 112, 114 may instead be formed of a same material as the insulating element 110. Further, in various non-limiting embodiments, the neutral layers 504, 506 may be formed of a neutral material having a lower dielectric constant K than the switching element 116. Providing the neutral layers 504, 506 with the lower dielectric constant K may help to funnel a greater portion of the electric field from the top electrode 502 into the switching layer 116 and this may in turn increase the electric field density in the switching layer 116. For example, the neutral layers 504, 506 may include material such as, but not limited to carbon doped oxides, silicon dioxides, silicon nitride, or combinations of the above.

Each memory device 500a, 500b, 500c may also include a single conductive line 522. A single interconnect 518 may be provided between the conductive line 522 and the active electrode 502 to electrically couple the active electrode 502 to the conductive line 522. Similar to FIG. 1A, the conductive line 522 and the interconnect 518 are not shown in FIG. 5A for simplicity. Although not shown in the figures, in various non-limiting embodiments, further conductive lines and interconnects may be included in each memory device 500a, 500b, 500c to provide external voltages to the inert electrodes 102, 104. For example, a first inert electrode conductive line may be electrically coupled to the first inert electrode 102 and a second inert electrode conductive line may be electrically coupled to the second inert electrode 104. Using the separate inert electrode conductive lines electrically coupled to the respective inert electrodes 102, 104, the inert electrodes 102, 104 may be provided with different voltages.

FIGS. 6A to 6F show simplified cross-sectional views that illustrate a method for fabricating the memory device 500a according to various non-limiting embodiments. To avoid cluttering the figures, the segments, surfaces and regions 116c-116e, 502a, 502b, 502c are not labelled in FIGS. 6A to 6F.

Referring to FIG. 6A, the method may include forming the first dielectric layer 126 and the inert electrodes 102, 104 in a manner similar to that described with reference to FIG. 2A.

Referring to FIGS. 6A and 6B, the method may further include forming the neutral layers 504, 506, and the further insulating elements 112, 114. As shown in FIG. 6A, the method may include depositing neutral material 508 over the first dielectric layer 126 and the inert electrodes 102, 104, and depositing dielectric material 510 over the neutral material 508. As shown in FIG. 6B, the neutral material 508 and the dielectric material 510 may be etched to form a recess 512 in the form of a wide trench via, thus forming the further insulating elements 112, 114 and the neutral layers 504, 506 simultaneously, and exposing the inert electrodes 102, 104.

Referring to FIGS. 6C to 6E, the method may further include forming the insulating element 110 and the switching element 116. In various non-limiting embodiments, the method may include depositing a liner 514 of switching material, where the deposition of the liner 514 may be guided by the further insulating elements 112, 114 and the recess 512. For example, as shown in FIG. 6C, the liner 514 may be deposited along the top surfaces of the further insulating elements 112, 114, and within the recess 512 (along the side surfaces of the further insulating elements 112, 114, and top surfaces of the inert electrodes 102, 104 and the first dielectric layer 126). The method may further include depositing insulating material 516 over the liner 514, such that part of the insulating material 516 is deposited into the recess 512.

As shown in FIG. 6D, a part of the insulating material 516 may be removed to form the insulating element 110. In various non-limiting embodiments, a first part 516a of the insulating material 516 above the liner 514 may first be removed, such that only the insulating material 516 within the recess 512 remains. A second part 516b of the insulating material 516 within the recess 512 may then be removed to form the insulating element 110. In a non-limiting example, the removal of the first part 516a of the insulating material 516 may be performed using a combination of a CMP process and an etchback process; whereas, the removal of the second part 516b may be performed by etching the insulating material 516 remaining within the recess 512.

As shown in FIG. 6E, a part of the liner 514 may be removed to form the switching element 116. For example, the part of the liner 514 above the insulating element 110 may be removed. This may be done using any method as known to those skilled in the art, for example, by performing an isotropic etch of the liner 514.

Referring to FIG. 6F, the method may further include forming the active electrode 502 over the insulating element 110 by depositing active electrode material into the recess 512. The method may also include forming the second dielectric layer 128, the interconnect 518 and the conductive line 522 in a similar manner as that described with reference to FIG. 2E, except that only a single interconnect 518 and a single conductive line 522 may be formed.

The above described order for the method is only intended to be illustrative, and the method is not limited to the above specifically described order unless otherwise specifically stated.

FIGS. 2A to 2E, 4A to 4E and 6A to 6F described above show fabrication of individual memory devices 100a, 300, 500a. A memory structure having a plurality of memory devices may be fabricated by forming the memory devices simultaneously using the methods illustrated in these figures. For instance, the memory structure 100 may be fabricated by forming memory devices 100a, 100b, 100c simultaneously. This may be done by forming the various electrodes 102, 104, 106, 108, and interconnects 118, 120, 518 of different memory devices 100a, 100b, 100c simultaneously. Further, a single one of each of the insulating elements 110, 112, 114, switching element 116, conductive lines 122, 124, 522 and dielectric layers 126, 128 may be formed and shared by the plurality of memory devices 100a, 100b, 100c. A memory structure having a plurality of memory devices 300 or the memory structure 500 may be formed in a similar manner. Accordingly, the memory devices 100a, 300, 500a may have high scalability.

In various non-limiting embodiments, each memory device 100a, 300 may be a RRAM memory device. The first additional segment 116d, 316d together with the first inert electrode 102 and the first active electrode 106 may function as a first RRAM unit corresponding to a first bit; whereas, the second additional segment 116e, 316e together with the second inert electrode 104 and the second active electrode 108 may function as a second RRAM unit corresponding to a second bit. Applying a set/reset voltage to the first conductive line 122 may provide a set/reset voltage difference between the inert and active electrodes 102, 106. This set/reset voltage difference may cause the formation/breaking of one or more conducting filaments in the first additional segment 116d, 316d. The formation of the conducting filament(s) may cause the resistance of the first additional segment 116d, 316d to switch to a lower resistance value; whereas, the breaking of the conducting filament(s) may cause the resistance of the first additional segment 116d, 316d to switch to a higher resistance value. Accordingly, the resistance of the first additional segment 116d, 316d may be switchable between the lower resistance value and the higher resistance value, and the first RRAM unit may be switchable between a low resistance state (LRS) and a high resistance state (HRS). The second RRAM unit may similarly be switchable between a LRS and a HRS by applying a set/reset voltage to the second conductive line 124. The memory device 100a, 300 may thus function as a two-bit RRAM device 100a, 300, where each bit corresponds to a respective RRAM unit and may be controlled by one of the conductive lines 122, 124.

In various non-limiting embodiments, the memory device 500a may also function as a two-bit RRAM device 500a. For example, the first additional segment 116d together with the first inert electrode 102 and the active electrode 502 may function as a first RRAM unit corresponding to a first bit; whereas the second additional segment 116e together with the second inert electrode 104 and the active electrode 502 may function as a second RRAM unit corresponding to a second bit. As mentioned above, in various non-limiting embodiments, separate first and second inert electrode conductive lines may be electrically coupled to the respective inert electrodes 102, 104 and thus, the first and second inert electrodes 102, 104 may be provided with different voltages. Accordingly, a set/reset voltage difference may be applied between the first inert electrode 102 and the active electrode 502 using the first inert electrode conductive line; whereas, a set/reset voltage difference may be applied between the second inert electrode 104 and the active electrode 502 using the second inert electrode conductive line. The first and second RRAM units of the memory device 500a may thus be switchable between a LRS and a FIRS by applying these set/reset voltage differences, where each bit corresponds to a respective RRAM unit and may be controlled by one of the inert electrode conductive lines electrically coupled to the inert electrodes 102, 104.

In various non-limiting embodiments, the additional segments 116d, 116e, 316d, 316e may be asymmetrical in shape, with their thickness (e.g. thickness 116t) being much smaller as compared to their height (e.g. height 116h) and length (e.g. length 116l). This helps to confine the conducting filament(s) between the inert electrodes 102, 104 and the active electrodes 106, 108 in one dimension. This can in turn help to reduce the cycle-to-cycle and device-to-device variability of the resistance values of each additional segment 116d, 116e, 316d, 316e in the memory device 100a, 300, 500a. In some non-limiting embodiments, the variability in the resistance values of each additional segment 116d, 116e, 316d, 316e in the memory device 100a, 300, 500a may be in the form of a linear function (as opposed to a quadratic function in prior art memory devices).

Confining the conducting filament(s) with the additional segments 116d, 116e, 316d, 316e allows better control of the formation of the conducting filament(s). By appropriately controlling the formation of the conducting filament(s), each RRAM unit may be switchable between more than two states, achieving a multi-state memory device. The improved confinement and control of the conducting filament(s) in the memory devices 100a, 300, 500a may also enhance the usefulness of these memory devices 100a, 300, 500a in neuromorphic computing development.

The set/reset voltage differences required to program the bits of the memory devices 100a, 300, 500a may also be reduced due to the lower height (e.g. height 116h) and smaller thickness (e.g. thickness 116t) of the additional segments 116d, 116e, 316d, 316e. In various non-limiting embodiments, the height 116h of the switching element 116 may be dependent on the thickness of the insulating element 110 and hence, using a thinner insulating element 110 may help to reduce the set/reset voltage differences required to program the bits of the memory devices 100a, 300, 500a. Further, as described above, the additional segments 116d, 116e, 316d, 316e may be arranged to extend between the inert electrodes 102, 104 and the active electrodes 106, 108, 502 and may be substantially perpendicular to the bottom surfaces of the active electrodes 106, 108, 502 and the top surfaces of the inert electrodes 102, 104. This allows electrical conduction between the inert electrodes 102, 104 and the active electrodes 106, 108, 502 to be achieved with straighter and hence, shorter conducting filament(s). Such conducting filament(s) can be formed with lower set voltage differences.

Further, the switching element 116, 316 may include polycrystalline material in some non-limiting embodiments. As compared to conducting filaments formed in amorphous material, conducting filaments formed in polycrystalline material may diffuse along the grain boundaries of the material and may have one dimensional (instead of two dimensional) shape fluctuations. This may help constrain the dimensions of the conducting filaments and in turn, reduce the variability in the resistance values of the switching element 116, 316 over different switching cycles. In addition, since the conducting filaments can diffuse along the grain boundaries of the polycrystalline material, they can be more easily formed. Thus, a smaller set voltage difference may be required to form the conducting filaments and the distribution of the required set/reset voltage differences over different switching cycles may be smaller.

Also, as described above, the memory devices 100a, 300, 500a may be fabricated with a simple, CMOS compatible stack process. The additional segments 116d, 116e, 316d, 316e of the switching element 116, 316 may be fabricated by depositing a liner, where the deposition may be guided by the further insulating elements 112, 114, 312, 314 and the recesses 202, 402, 512. Accordingly, substantially thin and short additional segments 116d, 116e, 316d, 316e may be achieved without the need for complex etching processes. The chances of shorting the active and inert electrodes 102, 104, 106, 108 are therefore reduced. Further, by fabricating the switching element 116, 316 in the manner described above, the dimensions of the switching element 116, 316 need not be limited by lithography technology.

Figure 7:
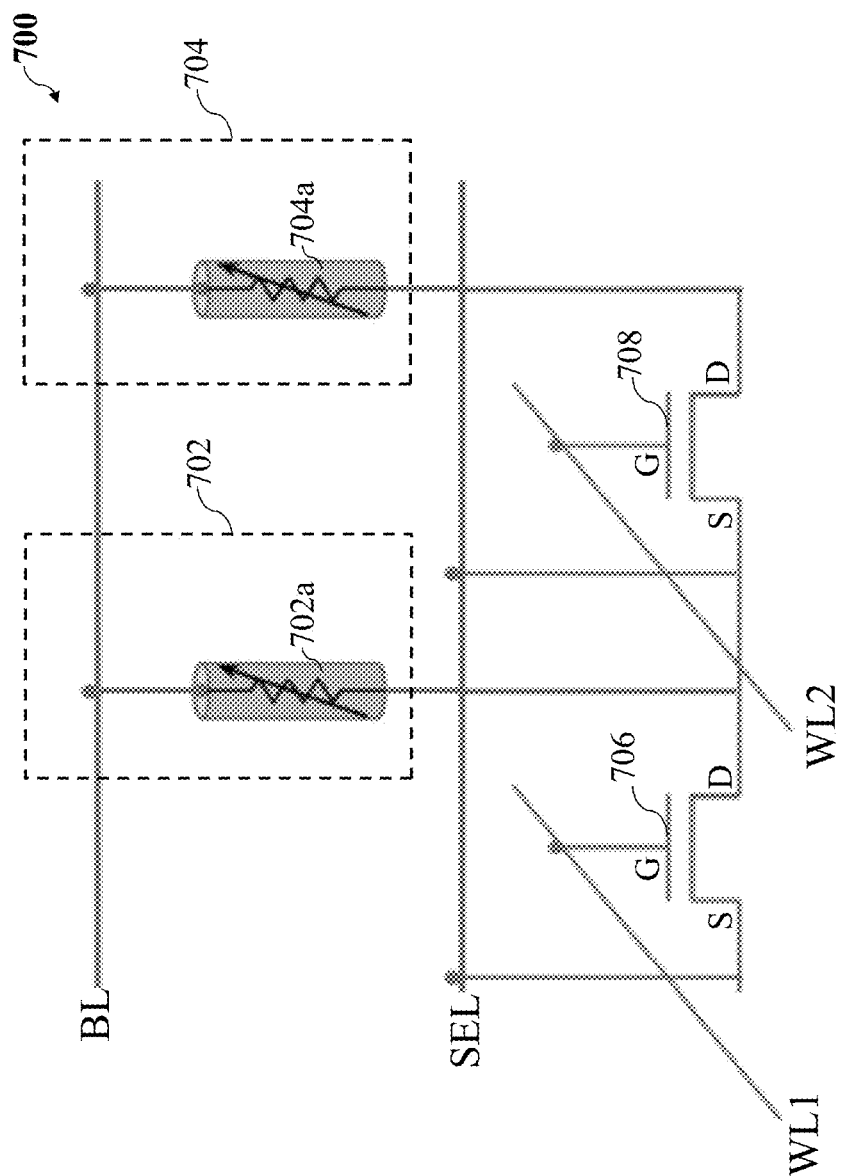
FIG. 7 shows a schematic diagram of a memory array including memory devices of FIG. 1B, FIG. 3 or FIG. 5B.

FIG. 7 shows a schematic diagram of a memory array 700 according to various non-limiting embodiments. The memory array 700 may have a one-transistor-n-resistors (1TnR) cross-bar configuration and may include a plurality of memory devices 702, 704. Each memory device 702, 704 may be similar to the memory devices 100a-100c, the memory device 300 or the memory devices 500a-500c. The conductive lines 122/124/522 of each memory device 702, 704 may function bit lines (BL). In the exemplary non-limiting embodiment in FIG. 7, a conductive line 122/124/522 of the memory device 702 may be integrally formed with a conductive line 122/124/522 of the memory device 704 as a single bit line (BL). Each memory device 702, 704 may have a RRAM unit 702a, 704a which may include an active electrode 106/108/502, an inert electrode 102/104 and an additional segment 116d/116e/316d/316e of the switching element 116/316 between the active electrode 106/108/502 and the inert electrode 102/104. The RRAM units 702a, 704a may be electrically coupled to the drains (D) of respective transistors 706, 708. The gates (G) of the transistors 706, 708 may be electrically coupled to first and second word lines (WL1, WL2) respectively. A select line (SEL) or in other words, source line may be electrically coupled to the sources (S) of the transistors 706, 708 to control the transistors 706, 708, so as to control the read and write operations of the memory devices 702, 704. In alternative non-limiting embodiments, the memory devices 100a, 300, 500a may also be used in a memory array with a different configuration, such as, but not limited to a one-transistor-one-resistor (1T1R) configuration.

The following examples pertain to further embodiments.

Example 1 may be a memory device including: at least one inert electrode; at least one active electrode; an insulating element arranged at least partially between the at least one active electrode and the at least one inert electrode; and a switching element arranged under the insulating element where the switching element may be arranged at least partially between the at least one active electrode and the at least one inert electrode; wherein the switching element may include a first end and a second end contacting the at least one active electrode; and a middle segment between the first end and the second end, wherein the middle segment at least partially contacts the at least one inert electrode.

In Example 2, the subject matter of Example 1 may optionally include that the at least one active electrode may include a plurality of active electrodes, and wherein the first end may contact a first active electrode of the plurality of active electrodes and the second end may contact a second active electrode of the plurality of active electrodes.

In Example 3, the subject matter of Example 1 may optionally include that the at least one active electrode may include a single active electrode.

In Example 4, the subject matter of any one of Examples 1 to 3 may optionally include that the at least one inert electrode may include a first inert electrode and a second inert electrode, and wherein the memory device may further include dielectric material between the first inert electrode and the second inert electrode, and wherein the switching element may be arranged at least partially over the dielectric material.

In Example 5, the subject matter of any one of Examples 1 to 3 may optionally include that the at least one inert electrode may include a first inert electrode and a second inert electrode, and wherein the insulating element may extend between the first inert electrode and the second inert electrode.

In Example 6, the subject matter of any one of Examples 1 to 5 may optionally include that the switching element may include at least one additional segment extending between the at least inert electrode and the at least one active electrode.

In Example 7, the subject matter of Example 6 may optionally include that the at least one additional segment may include a first additional segment and a second additional segment, and the middle segment may include one or more segments between the first additional segment and the second additional segment, wherein the one or more segments of the middle segment may extend in a direction different from the additional segments.

In Example 8, the subject matter of Example 6 may optionally include that the at least one additional segment may include a first additional segment and a second additional segment, and the middle segment may include alternating first segments and second segments between the first additional segment and the second additional segment, wherein the first segments and the second segments of the middle segment may extend in different directions.

In Example 9, the subject matter of Example 8 may optionally include that the middle segment of the switching element may contact a top surface and a side surface of each of the at least one inert electrode.

In Example 10, the subject matter of any one of Examples 1 to 9 may optionally include that the memory device may further include further insulating elements arranged at least partially over the at least one inert electrode, and wherein the switching element may be at least partially arranged between the insulating element and each further insulating element.

In Example 11, the subject matter of Example 10 may optionally include that the further insulating elements may be arranged at least partially under the at least one active electrode.

In Example 12, the subject matter of Example 10 may optionally include that the further insulating elements may be arranged adjacent to the at least one active electrode.

In Example 13, the subject matter of any one of Examples 1 to 12 may optionally include that a thickness of the switching element may range from 1 nm to 10 nm.

In Example 14, the subject matter of any one of Examples 1 to 13 may optionally include that the switching element may include polycrystalline material.

Example 15 may be a method including: forming at least one inert electrode; forming an insulating element at least partially over the at least one inert electrode; forming a switching element under the insulating element; and forming at least one active electrode over the switching element and the insulating element, such that the switching element may be arranged at least partially between the at least one active electrode and the at least one inert electrode; wherein the switching element may include a first end and a second end contacting the at least one active electrode; and a middle segment between the first end and the second end, wherein the middle segment may at least partially contact the at least one inert electrode.

In Example 16, the subject matter of Example 15 may optionally include that the method may further include forming further insulating elements at least partially over the at least one inert electrode, and wherein forming the switching element may further include depositing a liner at least partially along one or more surfaces of each further insulating element.

In Example 17, the subject matter of Example 16 may optionally include that forming the insulating element may include depositing insulating material over the liner.

In Example 18, the subject matter of Example 17 may optionally include that forming the insulating element and the switching element may further include removing a part of the insulating material and a part of the liner such that a top surface of the insulating element, top surfaces of the further insulating elements, and the first and second ends of the switching element may be aligned.

Example 19 may be a memory structure including a plurality of memory devices, wherein each memory device may include: at least one inert electrode; at least one active electrode; an insulating element arranged at least partially between the at least one active electrode and the at least one inert electrode; a switching element arranged under the insulating element where the switching element may be arranged at least partially between the at least one active electrode and the at least one inert electrode; wherein the switching element may include: a first end and a second end contacting the at least one active electrode; and a middle segment between the first end and the second end, wherein the middle segment may at least partially contact the at least one inert electrode.

In Example 20, the subject matter of Example 19 may optionally include that the switching elements of the plurality of memory devices may be formed as a single continuous switching element.

The invention may be embodied in other specific forms without departing from the spirit or essential characteristics thereof. The foregoing embodiments, therefore, are to be considered in all respects illustrative rather than limiting the invention described herein. Scope of the invention is thus indicated by the appended claims, rather than by the foregoing description, and all changes that come within the meaning and range of equivalency of the claims are intended to be embraced therein.

The invention claimed is:

1. A memory device comprising:
    at least two inert electrodes;
    at least one active electrode;
    an insulating element arranged at least partially between the at least one active electrode and the at least two inert electrodes; and
    a switching element arranged under the insulating element where the switching element is arranged at least partially between the at least one active electrode and the at least two inert electrodes;
    wherein the switching element comprises:
        a first end and a second end contacting directly the at least one active electrode; and
        a middle segment between the first end and the second end, wherein the middle segment at least partially contacts the at least two inert electrodes and the middle segment is a continuous middle segment joining the first end and the second end,
    wherein the continuous middle segment of the switching element extends between one of the at least two inert electrodes and another one of the at least two inert electrodes.

2. The memory device of claim 1, wherein the at least one active electrode comprises a plurality of active electrodes, and wherein the first end contacts a first active electrode of the plurality of active electrodes and the second end contacts a second active electrode of the plurality of active electrodes.

3. The memory device of claim 1, wherein the at least two inert electrodes comprise a first inert electrode and a second inert electrode, and wherein the memory device further comprises dielectric material between the first inert electrode and the second inert electrode, and wherein the switching element is arranged at least partially over and overlapping the dielectric material.

4. The memory device of claim 1, wherein the at least two inert electrodes comprise a first inert electrode and a second inert electrode, and wherein the insulating element extends between the first inert electrode and the second inert electrode.

5. The memory device of claim 1, wherein the switching element comprises at least one additional segment extending between the at least two inert electrodes and the at least one active electrode.

6. The memory device of claim 5, wherein the at least one additional segment comprises a first additional segment and a second additional segment, and the middle segment comprises one or more segments between the first additional segment and the second additional segment, wherein the one or more segments of the middle segment extend in a direction different from the additional segments.

7. The memory device of claim 5, wherein the at least one additional segment comprises a first additional segment and a second additional segment, and the middle segment comprises alternating first segments and second segments between the first additional segment and the second additional segment, wherein the first segments and the second segments of the middle segment extend in different directions.

8. The memory device of claim 7, wherein the middle segment of the switching element contacts a top surface and a side surface of each of the at least two inert electrodes.

9. The memory device of claim 1, wherein the memory device further comprises further insulating elements arranged at least partially over the at least two inert electrodes, and wherein the switching element is at least partially arranged between the insulating element and each further insulating element.

10. The memory device of claim 9, wherein the further insulating elements are arranged at least partially under the at least one active electrode.

11. The memory device of claim 9, wherein the further insulating elements are arranged adjacent to the at least one active electrode.

12. The memory device of claim 1, wherein a thickness of the switching element ranges from 1 nm to 10 nm.

13. The memory device of claim 1, wherein the switching element comprises polycrystalline material.

14. A method comprising:
forming at least two inert electrodes;
forming an insulating element at least partially over the at least two inert electrodes;
forming a switching element under the insulating element; and
forming at least one active electrode over the switching element and the insulating element, such that the switching element and the insulating element are arranged at least partially between the at least one active electrode and the at least two inert electrodes;
wherein the switching element comprises:
a first end and a second end contacting directly the at least one active electrode; and
a middle segment between the first end and the second end, wherein the middle segment at least partially contacts the at least two inert electrodes and the middle segment is a continuous middle segment joining the first end and the second end,
wherein the continuous middle segment of the switching element extends between one of the at least two inert electrodes and another one of the at least two inert electrodes.

15. The method of claim 14, further comprising forming further insulating elements at least partially over the at least two inert electrodes, and wherein forming the switching element further comprises depositing a liner at least partially along one or more surfaces of each further insulating element.

16. The method of claim 15, wherein forming the insulating element comprises depositing insulating material over the liner.

17. The method of claim 16, wherein forming the insulating element and the switching element further comprise removing a part of the insulating material and a part of the liner such that a top surface of the insulating element, top surfaces of the further insulating elements, and the first and second ends of the switching element are aligned.

18. A memory structure comprising a plurality of memory devices, wherein each memory device comprises:
at least two inert electrodes;
at least one active electrode;
an insulating element arranged at least partially between the at least one active electrode and the at least two inert electrodes;
a switching element arranged under the insulating element where the switching element is arranged at least partially between the at least one active electrode and the at least two inert electrodes;
wherein the switching element comprises:
a first end and a second end contacting directly the at least one active electrode; and
a middle segment between the first end and the second end, wherein the middle segment at least partially contacts the at least two inert electrodes and the middle segment is a continuous middle segment joining the first end and the second end,
wherein the continuous middle segment of the switching element extends between one of the at least two inert electrodes and another one of the at least two inert electrodes.

19. The memory structure of claim 18, wherein the switching elements of the plurality of memory devices are formed as a single continuous switching element.

* * * * *